United States Patent [19]
Arima

[11] Patent Number: 5,486,712
[45] Date of Patent: Jan. 23, 1996

[54] DRAM HAVING PERIPHERAL CIRCUITRY IN WHICH SOURCE-DRAIN INTERCONNECTION CONTACT OF A MOS TRANSISTOR IS MADE SMALL BY UTILIZING A PAD LAYER AND MANUFACTURING METHOD THEREOF

[75] Inventor: Hideaki Arima, Hyogo, Japan

[73] Assignee: Mitsubishi Denki Kabushiki Kaisha, Tokyo, Japan

[21] Appl. No.: 232,315

[22] Filed: Apr. 25, 1994

Related U.S. Application Data

[63] Continuation of Ser. No. 690,843, Apr. 24, 1991, abandoned.

[30] Foreign Application Priority Data

May 1, 1990 [JP] Japan ..................... 2-115642

[51] Int. Cl.$^6$ ................. H01L 27/108; H01L 29/772
[52] U.S. Cl. ................. 257/296; 257/306; 257/309; 257/501
[58] Field of Search ................. 257/306, 309, 257/296, 501

[56] References Cited

U.S. PATENT DOCUMENTS

| | | | |
|---|---|---|---|
| 4,931,845 | 6/1990 | Ema | 257/296 |
| 5,196,910 | 3/1993 | Moriuchi et al. | 257/296 |

FOREIGN PATENT DOCUMENTS

| | | |
|---|---|---|
| 0161850 | 11/1985 | European Pat. Off. . |
| 3910033A1 | 10/1989 | Germany . |
| 4113733A1 | 10/1991 | Germany . |
| 4113233A1 | 10/1991 | Germany . |
| 64-80066 | 3/1989 | Japan . |
| 2-76257 | 3/1990 | Japan . |

OTHER PUBLICATIONS

Kaga et al, "A Crown Type Stacked Capacitor Cell for a 1.5V Operation 64 DRAM", Proceedings of 37th Applied Physics Association Conference, 2nd vol., p. 582.

Wakamiya et al, "Novel Stacked Capacitor Cell for 64Mb DRAM", 1989 Symposium on VLSI Technology Digest of Technical Papers, pp. 69–70.

*Primary Examiner*—Jerome Jackson
*Attorney, Agent, or Firm*—Lowe, Price, LeBlanc & Becker

[57] ABSTRACT

A MOS transistor included in a peripheral circuit of a DRAM has conductive layers for interconnection on respective surfaces of a pair of source•drain regions. The source•drain interconnection layers are electrically connected to the source•drain regions through the conductive layers. One of the pair of conductive layers is formed in the same step as a bit line of a memory cell, by the same material as the bit line. The other one of the pair of conductive layers is formed in the same step as a storage node of a capacitor of the memory cell, by using the same material as the storage node. The pair of conductive layers prevent direct connection between the source•drain interconnection layer and the source•drain regions, so that reduction in size of the source•drain regions can be realized.

15 Claims, 9 Drawing Sheets

FIG. 2(B) PERIPHERAL CIRCUIT

FIG. 2(A) MEMORY CELL

DRAM HAVING PERIPHERAL CIRCUITRY IN WHICH SOURCE-DRAIN INTERCONNECTION CONTACT OF A MOS TRANSISTOR IS MADE SMALL BY UTILIZING A PAD LAYER AND MANUFACTURING METHOD THEREOF

This application is a continuation of application Ser. No. 07/690,843 filed Apr. 24, 1991 abandoned.

BACKGROUND OF THE INVENTION

1. Field of the Invention

The present invention relates to a semiconductor memory device and, more specifically, to a highly integrated structure of a DRAM having a so called cylindrical stacked capacitor and to a manufacturing method thereof.

2. Description of the Background Art

Developments have been made in the field of semiconductor memory devices, especially in dynamic random access memories (DRAMs) to increase degree of integration and to reduce the size of device structures, so as to realize increase in memory capacity and to realize higher responsiveness.

Figure 5:
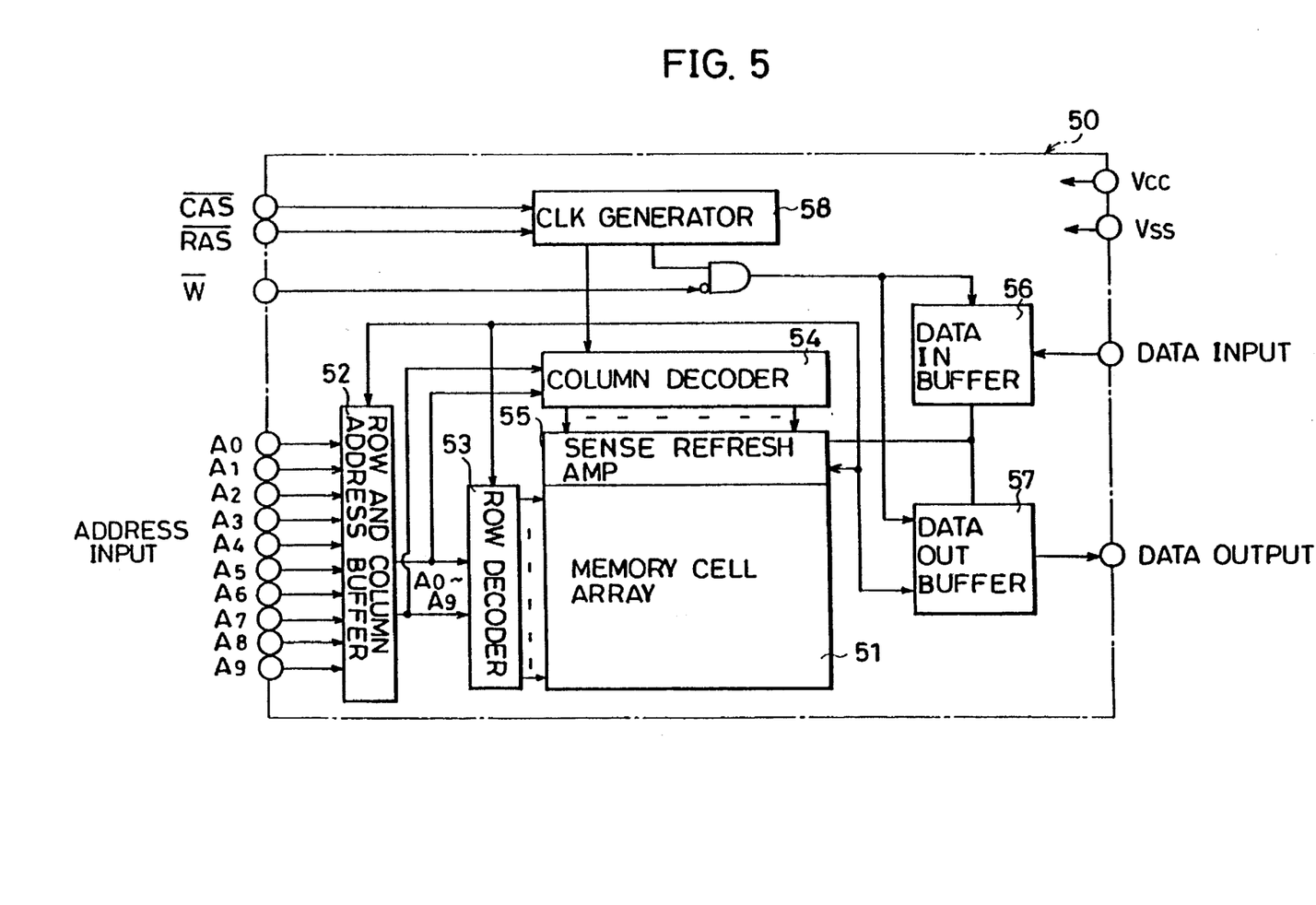
FIG. 5 is a block diagram showing a structure of a general DRAM.

FIG. 5 is a block diagram of a DRAM. Referring to FIG. 5, a schematic structure of a DRAM will be described. Generally, a DRAM includes a memory cell array as a memory region storing pieces of memory information, and a peripheral circuitry necessary for external input/output. More specifically, a DRAM 50 comprises a memory cell array 51 for storing data signals of memory information; a row and column address buffer 52 for receiving external address signals for selecting a memory cell constituting a unit memory circuit; a row decoder 53 and a column decoder 54 for designating the memory cell by decoding the address signals; a sense refresh amplifier 55 for amplifying and reading a signal stored in the designated memory cell; a data in buffer 56 and a data out buffer 57 for inputting/outputting data; and a clock generator 58 for generating a clock signal.

The memory cell array 51 occupying a large area on a semiconductor chip comprises a plurality of memory cells each storing unit memory information. The memory capacity of the DRAM is defined by the number of memory cells arranged in the memory cell array 51. Therefore, various improvements have been done to make smaller the structure of a MOS transistor and a capacitor forming the memory cell so as to increase degree of integration in the memory cell array 51. For example, in the MOS transistor constituting the memory cell, channel length is shortened to make small the structure of the element, and by improving element isolating structure, spaces between elements have been made smaller. However, capacitors have been obstructive to the reduction in size of structures, since the capacitor capacity is proportional to the area between opposing electrodes, and it is necessary to ensure a capacity larger than a prescribed amount for reliability of memory operation as a memory device. Accordingly, capacitor structure has been improved to make the cell structure of the memory cell smaller while ensuring capacitor capacity, resulting in a so called cylindrical stacked capacitor cell.

Figure 6:
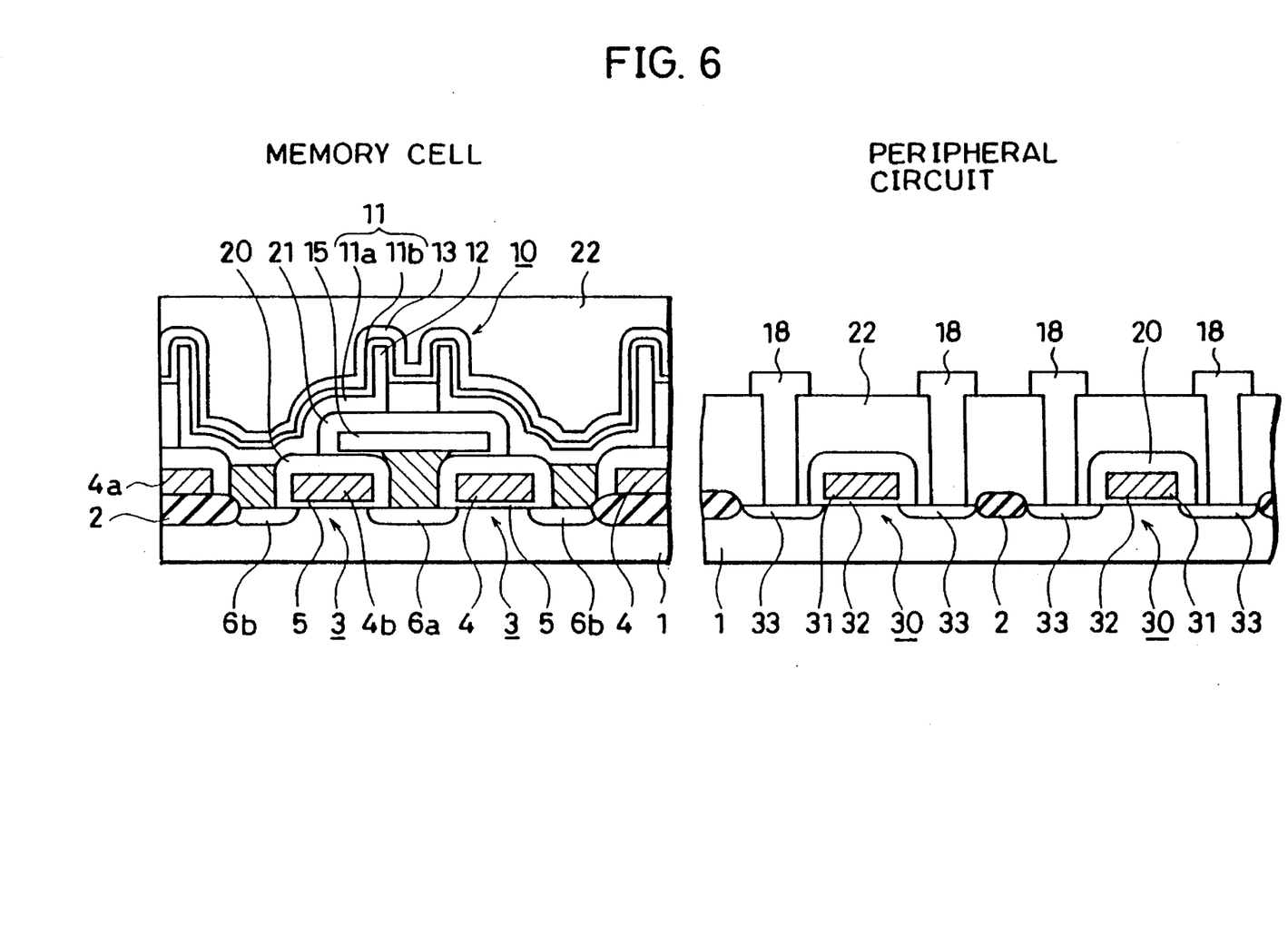
FIG. 6 is a schematic cross sectional view of a conventional DRAM having a cylindrical stacked capacitor.

FIG. 6 is a cross sectional structure of a DRAM disclosed in, for example, "A CROWN TYPE STACKED CAPACITOR CELL FOR A 1.5V OPERATION 64MDRAM", Kaga et al, Proceedings of 37th Applied Physics Association Conference, 2nd volume, P582. FIG. 6 shows a memory cell portion and a peripheral circuitry portion. The memory cell comprises one transfer gate transistor 3 and one capacitor 10. The transfer gate transistor 3 has a pair of source•drain.regions 6a, 6b formed on a surface of a silicon substrate 1, and gate electrodes (word lines) 4b, 4c formed on the surface of the silicon substrate 1 between the source•drain regions 6a, 6b with a gate insulating layer 5 posed therebetween. Above a field oxide film 2 covering a prescribed region on the surface of the silicon substrate 1, word lines 4a and 4d extending to adjacent memory cells are formed. The surfaces of the gate electrodes (word lines) 4a to 4d are covered with a first insulating layer 20.

A bit line 15 is connected to one of the source•drain regions 6a of the transfer gate transistor 3. The bit line 15 is formed of a two-layered polycrystalline silicon layer. A portion which is to be connected to one of the source•drain regions 6a of the transfer gate transistor 3 is formed by selective CVD method. The surface of the bit line 15 is covered with a second insulating layer 21.

The capacitor 10 has a stacked structure of a lower electrode (storage node) 11, a dielectric layer 12 and an upper electrode (cell plate) 13. The lower electrode 11 has a base portion 11a extending over the gate electrodes 4a to 4d or the bit line 15, and an upright wall portion 11b extending vertically upward. A portion of the lower electrode 11 is connected to the other one of the source•drain regions 6b of the transfer gate transistor 3 through a polycrystalline silicon layer embedded in the contact portion. A capacitor portion of the capacitor 10 is constituted by the surface of the base portion 11a and inner and outer surfaces of the wall portion 11b of the lower electrode 11. Since the wall portion 11b can be utilized as the capacitor portion, the capacitor capacity can be increased without increasing the planar area of occupation of the capacitor.

The peripheral circuitry such as the input/output buffer has a number of MOS transistors 30 as structural components. A MOS transistor 30 has a pair of source•drain regions 33, 33, and a gate electrode 31 formed on a gate insulating layer 32. A first insulating layer 20 surrounds the gate electrode 31. An interconnection layer 18 is connected to the source•drain regions 33, 33 through a contact formed in an interlayer insulating layer 22.

However, in conventional DRAM having a cylindrical stacked capacitor, large steps have been generated at surfaces of the insulating layers and interconnection layers, due to the heights of functional elements between the memory cell region and the peripheral circuitry portion. During manufacturing the DRAM, the MOS transistors 3 and 30 in the memory cell region and the peripheral circuitry are formed simultaneously by approximately the same processes, and then the capacitor 10 in the memory cell portion is manufactured. In this step, the capacitor 10 is formed high above the surface of the silicon substrate in the memory region, while the MOS transistor 30 is formed in the peripheral circuitry. Therefore, when an interlayer insulating layer 22 is formed on the entire surface in the succeeding step, the position of the surfaces in the memory cell region and the peripheral circuitry region is very much different, causing a large step. Consequently, in the succeeding step of lithography, precision in patterning is degraded if the step is larger than focal depth of an exposure apparatus, making it difficult to provide fine and small structures. For example, when the interconnection layer 18 is to be connected to the source•drain regions 33 in the peripheral circuitry, precision in registration may be degraded, and in order to prevent the degradation, diffusion width of the source•drain regions 33 must be set larger. This prevents reduction in size of the transistor.

SUMMARY OF THE INVENTION

An object of the present invention is to provide a highly integrated structure of a DRAM having a cylindrical stacked capacitor in which transistor structure of a peripheral circuitry can be made small.

Another object of the present invention is to make small contact region of the source•drain interconnection in the MOS transistor included in the peripheral circuitry of the DRAM.

A further object of the present invention is to make small transistor structure of the peripheral circuitry of a DRAM without increasing the number of manufacturing steps.

A still further object of the present invention is to provide a method of manufacturing a DRAM in which a MOS transistor in the peripheral circuitry has a pad layer.

A DRAM in accordance with the present invention includes a memory cell region having a plurality of memory cells each formed of one MOS transistor and one capacitor, and a peripheral circuitry for writing/reading prescribed memory information to and from the memory cell region. The DRAM comprises a MOS transistor for a memory cell having a pair of first impurity regions formed in a semiconductor substrate and a first gate electrode formed on the semiconductor substrate between the pair of first impurity regions; and a MOS transistor for the peripheral circuitry having a pair of second impurity regions formed in the semiconductor substrate and a second gate electrode formed on the semiconductor substrate between the pair of second impurity regions. Further, the DRAM comprises a first conductive layer connected to one of the impurity regions of the MOS transistor for the memory cell; a second conductive layer connected to the other impurity region of the MOS transistor for the memory cell serving as a lower electrode of a capacitor; a third conductive layer connected to one of the impurity regions of the MOS transistor for the peripheral circuitry, extending above the second gate electrode of the MOS transistor for the peripheral circuitry formed of the same material as that of the first conductive layer in the memory cell region; and a fourth conductive layer connected to the other one of the impurity regions of the MOS transistor for the peripheral circuitry, extending above the second gate electrode of the MOS transistor for the peripheral circuitry, formed of the same material as the second conductive layer in the memory cell region.

The third and fourth conductive layers connected to the source•drain regions of the MOS transistor of the peripheral circuitry and extending over the gate electrode are used as an internal interconnection layer between adjacent MOS transistors, for example. In addition, the interconnection layer connected to the source•drain regions may be connected to the source•drain regions through the third and fourth conductive layers. Therefore, diffusion width of the source•drain regions and the interconnection layer can be reduced, thereby making smaller the element structure of the MOS transistor.

A method of manufacturing a DRAM including memory cells each formed of one MOS transistor and one stacked capacitor and a peripheral circuitry having MOS transistors in accordance with the present invention comprises the following steps of: forming MOS transistor on a memory cell region and a peripheral circuitry region on a main surface of a semiconductor substrate; forming a first conductive layer on the entire surface of the semiconductor substrate and patterning the same to form an electrode layer connected to one of the impurity regions of a MOS transistor of a memory cell, and to form a first interconnection layer connected to one of the impurity regions of a MOS transistor in the peripheral circuitry extending above at least a gate electrode; covering surfaces of the electrode layer and of the first interconnection layer with an insulating layer; forming a second conductive layer on the entire surface of the semiconductor substrate and patterning the same to form a lower electrode of a capacitor connected to the other one of the impurity regions of the MOS transistor in the memory cell and to form a second interconnection layer connected to the other one of the impurity regions of the MOS transistor in the peripheral circuitry, extending at least above the gate electrode.

Since third and fourth conductive layers of the MOS transistor in the peripheral circuitry are formed by patterning the conductive layers formed by the same steps as the first and second conductive layers of the memory cell, the third and fourth conductive layers of the MOS transistor in the peripheral circuitry can be formed without adding new steps of manufacturing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a DRAM in accordance with a first embodiment of the present invention.

FIG. 1(A) is a plan view of a memory cell portion, while

FIG. 2 is a cross sectional view of a DRAM of FIG. 1.

DESCRIPTION OF THE PREFERRED EMBODIMENTS

Figure 1A:
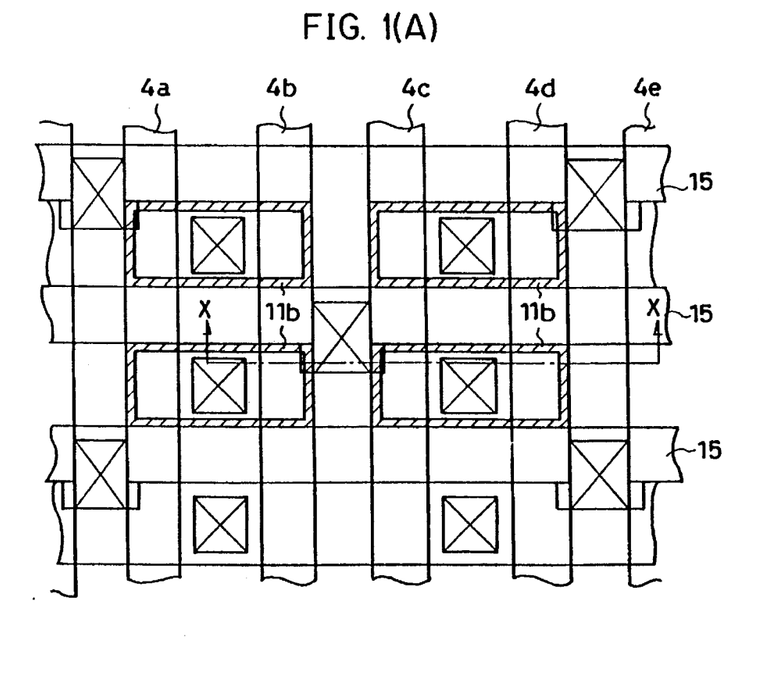
Figure 1B:
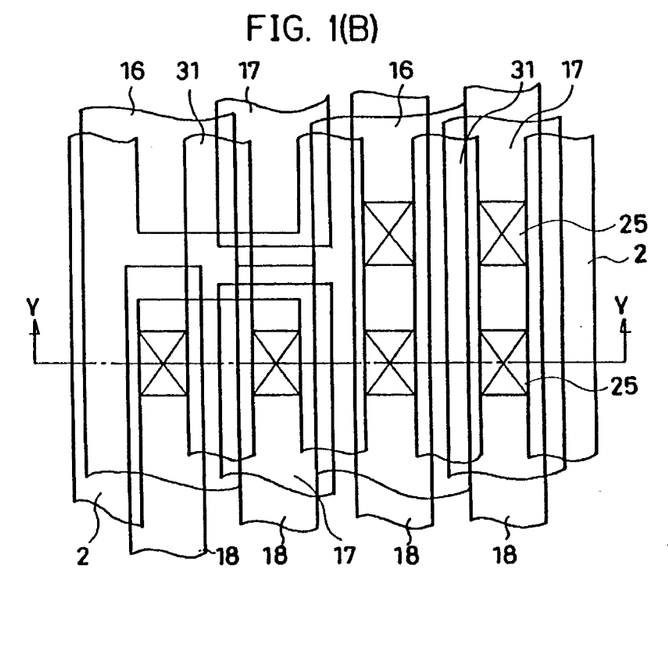
FIG. 1(B) is a plan view of a peripheral circuitry.
Figure 2A:
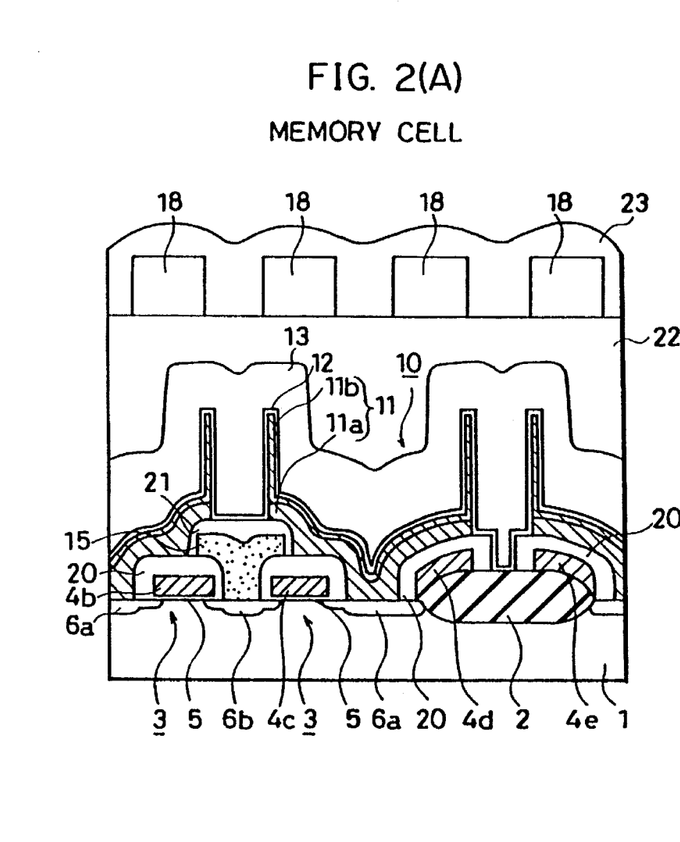
FIG. 2(A) is a cross sectional view of the memory cell taken along the line X—X of FIG. 1(A)
Figure 2B:
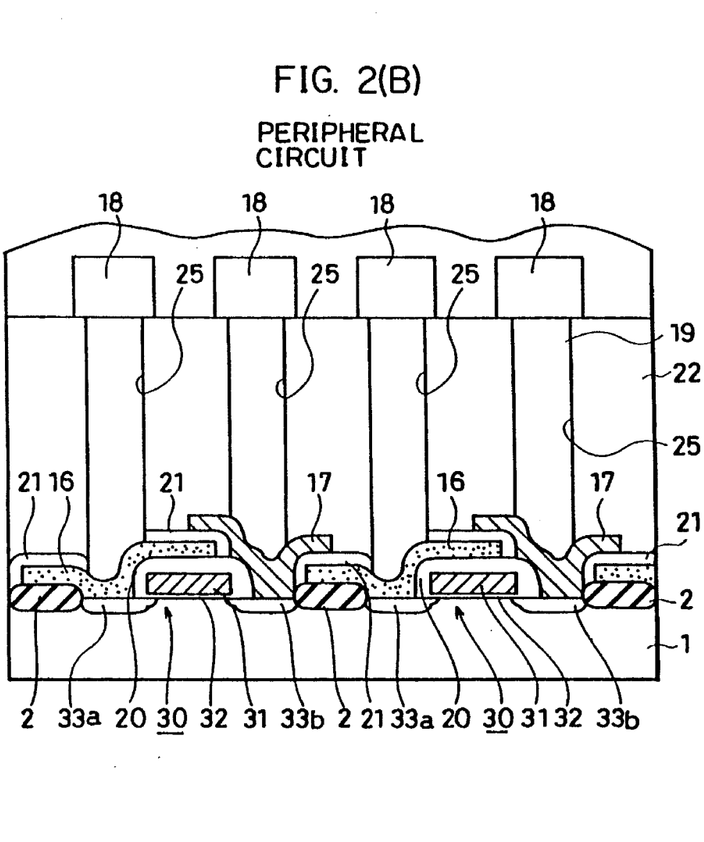
FIG. 2(B) is a cross sectional view of the peripheral circuitry portion taken along the line Y—Y of FIG. 1(B).

Referring to FIGS. 1 and 2, field oxide films 2 for isolating elements are formed at prescribed regions on a surface of a P type silicon substrate 1. A memory cell is formed in an element forming region covered with the field oxide film 2. A memory cell comprises one transfer gate transistor 3 and one capacitor 10 connected thereto.

A transfer gate transistor 3 comprises a pair of source•drain regions 6a, 6b, and gate electrodes 4b and 4c formed on the silicon substrate between the source•drain regions 6a and 6b with a gate insulating layer 5 formed therebetween. The source•drain regions 6a and 6b have a so called LDD structure. The gate electrodes 4b and 4c are formed of portions of word lines. Word lines 4d and 4e which are to be gate electrodes of adjacent memory cells are formed on the field oxide film 2. The surfaces of the gate electrodes 4b, 4c and word lines 4d and 4e are covered with a first insulating layer 20.

A bit line (first conductive layer) 15 extends above the word lines 4b to 4e in a direction orthogonal to the word lines 4b to 4e, and a portion of which is connected to one of the source•drain regions 6b of the transfer gate transistor 3. The bit line 15 is formed of conductive polycrystalline silicon, a high melting point metal such as tungsten (W) or polycide having a stacked structure of polycrystalline silicon and a high melting point metal silicide such as $TiSi_2$, $WSi_2$, $MoSi_2$. The surface of the bit line 15 is covered with a second insulating layer 21.

The capacitor 10 has a stacked structure of a lower electrode (storage node: second conductive layer) 11, a dielectric layer 12 and an upper electrode (cell plate) 13. The lower electrode 11 has a two-layered structure including a base portion 11a connected to one of the source•drain regions 6a of the transfer gate transistor 3, and an upright wall portion 11b extending vertically upward from a peripheral portion of the base portion 11a. The base portion 11a is formed to have the thickness of about 2000 Å, and the wall portion 11b is formed to have the thickness of about 500 Å. The polycrystalline silicon of the lower electrode 11 is doped with impurities to have a concentration not lower than $10^{20}/cm^3$. A high melting point metal or a polycide having a stacked structure of polycrystalline silicon and a high melting point metal silicide may be used for the lower electrode 11.

An oxide film, a nitride film, a composite film of an oxide film and a nitride film, tantalum pentoxide film ($Ta_2O_5$) or a hafnium oxide film ($HaO_2$) is used as the dielectric layer 12. The upper electrode 13 is formed of a conductive polycrystalline silicon layer or a metal layer. The height of the wall portion 11b of the capacitor is set dependent on the necessary capacitor capacity, and generally it is 1 to 2 μm from the surface of the silicon substrate 1.

The peripheral circuitry portion includes a MOS transistor 30 as a component of a circuit. The MOS transistor 30 in the peripheral circuitry comprises a pair of source•drain regions 33a, 33b, a gate insulating layer 32 and a gate electrode 31, as those the transfer gate transistor 3 in the memory cell. The source•drain regions 33a and 33b have a so called LDD structure including low concentration regions and high concentration regions continuous thereto arranged opposed to each other on both sides of a channel region of the transistor. The surface of the gate electrode 31 is covered with a first insulating layer 20. A first source•drain conductive layer (third conductive layer) 16 is connected to one of the source•drain regions 33a. The first source•drain conductive layer 16 is formed of the same material as the bit line 15, and one end of which is extending above the field oxide film 2, and the other end extends above the gate electrode 31 with the first insulating layer 20 posed therebetween. Further, it extends between adjacent MOS transistors and used as an interconnection layer constituting prescribed circuitry. A second source•drain conductive layer (fourth conductive layer) 17 is formed in the other one of the source•drain regions 33b of the MOS transistor 30. The second source•drain conductive layer 17 has a portion thereof superposed on an upper portion of the first source•drain conductive layer 16 with a second insulating layer 21 posed therebetween. The second source•drain conductive layer 17 is formed of the same material as the base portion 11a of the lower electrode of the capacitor 10. Similar to the first source•drain conductive layer 16, it is also used as an interconnection layer between adjacent MOS transistors.

Surfaces of elements in the memory cell portion and in the peripheral circuitry portion are covered with an interlayer insulating layer 22 having relatively flat surface. An interconnection layer 18 of a prescribed pattern is formed on the surface of the interlayer insulating layer 22. In the peripheral circuitry portion shown in the figure, the interconnection layer 18 is connected to the first and second source•drain conductive layers 16 and 17 connected to the MOS transistor 30, through contact holes 25 formed in the interlayer insulating layer 22. The contact holes 25 are formed to electrically connect the source•drain regions 33a and 33b with the interconnection layer 18. The contact holes may be formed at any positions on the surface of the first and second source•drain conductive layers 16 and 17. Therefore, even if the diffusion width of the source•drain regions 33a and 33b is made small, good connection with the interconnection layer 18 can be provided. This enables reduction in size of the MOS transistor 30 in the peripheral circuitry portion.

Main steps of manufacturing the DRAM shown in FIG. 2 will be described with reference to FIGS. 3A to 3J.

Figure 3A:
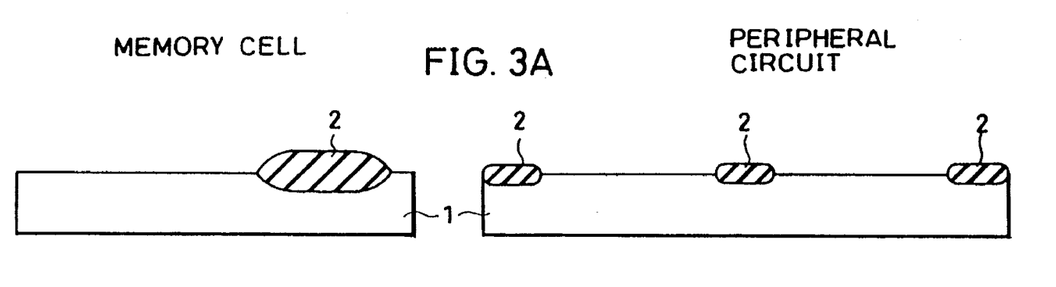
FIGS. 3A, 3B, 3C, 3D, 3E, 3F, 3G, 3H, 3I and 3J are cross sectional views showing steps of manufacturing the DRAM shown in FIG. 2.

First, referring to FIG. 3A, field oxide films 2 for isolating elements are formed by LOCOS method on prescribed regions on a surface of a p type silicon substrate 1.

Figure 3B:
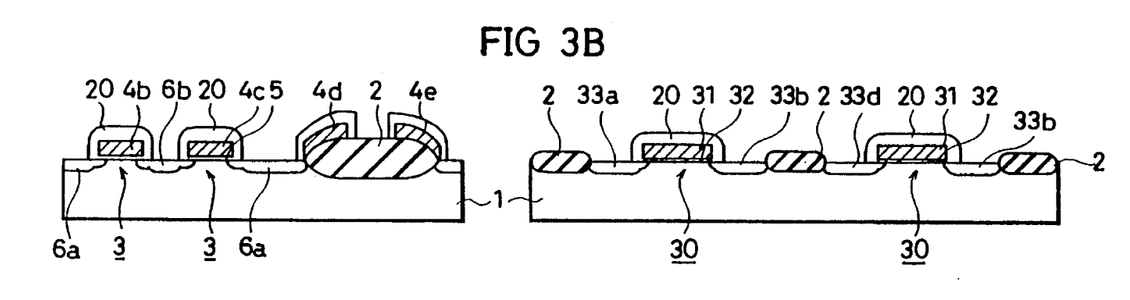

Referring to FIG. 3B, gate oxide films 5 and 32 having the thickness of about 100 to 120 Å are formed on the p type silicon substrate 1 by, for example, thermal oxidation. Further, a polycrystalline silicon layer having the thickness of about 1000 to 2000 Å and an oxide film are formed on surfaces of the gate oxide films 5 and 32, and the films are patterned to a prescribed shape. Consequently, gate electrodes (word lines) 4b to 4e and a gate electrode 31 are formed. Then, by using the gate electrodes 4b to 4e and a gate electrode 31 as masks, n type impurity ions are implanted to the silicon substrate 1 to form low concentration regions of the source•drain regions 6a and 6b of the transfer gate transistor 3 and low concentration regions of the source-drain regions 33a and 33b of the MOS transistor 30. Further, an oxide film is deposited on the entire surface and anisotropic etching is effected thereto, so as to from an insulating layer on sidewalls of the gate electrodes 4b to 4e and of the gate electrode 31. Consequently, surfaces of the gate electrodes 4b to 4e and 31 are covered with the first insulating layer 20. Then, using the insulating layer 20 as a mask, n type impurities of high concentration are introduced to the silicon substrate 1, so as to form high concentration regions of the source-drain regions 6a and 6b of the transfer gate transistor 3 and the high concentration regions of the source•drain regions 33a and 33b of the MOS transistor 30.

Figure 3C:
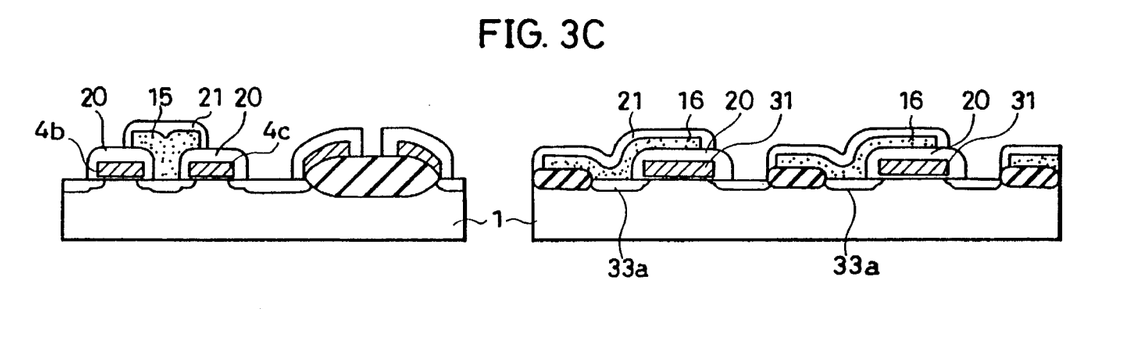

Further, referring to FIG. 3C, a doped polysilicon layer is deposited to the thickness of about 1000 to 2000 Å and an oxide film is formed thereon on the surface of the silicon substrate 1, and they are pattered to a prescribed shape by photolithography and etching. Consequently, a bit line 15 is formed in the memory cell portion, and a first source•drain conductive layer 16 is formed in the peripheral circuit portion. Then, surfaces of the bit line 15 and the first source•drain conductive layer 16 are covered with a second insulating layer 21.

Figure 3D:
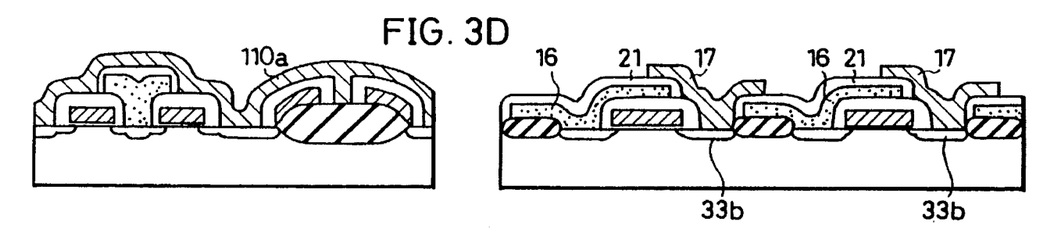

Further, referring to FIG. 3D, a doped polysilicon layer is deposited to the thickness of about 2000 Å on the entire surface of the silicon substrate, and it is patterned to a prescribed shape. Consequently, a polycrystalline silicon layer 110 constituting a portion of the lower electrode 11 of the capacitor is formed in the memory cell portion, and a second source•drain conductive layer 17 of the MOS transistor 30 is formed in the peripheral circuitry portion. The second source•drain conductive layer 17 is patterned with one end superposed on the first source•drain conductive layer 16. Although not shown, the first and second source•drain conductive layers 16 and 17 may be formed to have an interconnection pattern connecting adjacent elements on the same level.

Figure 3E:
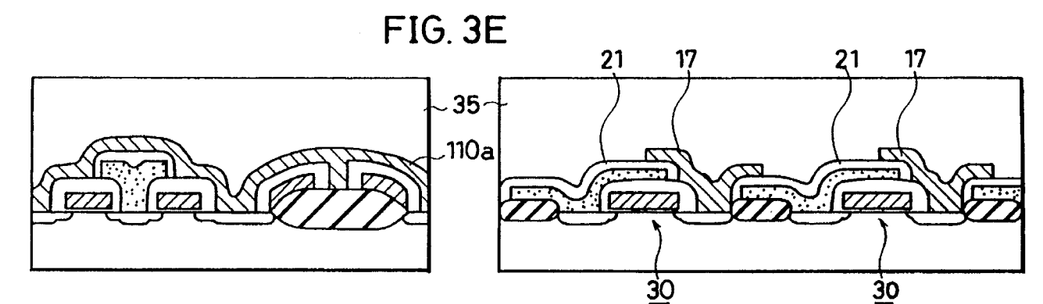

Then, referring to FIG. 3E, a thick oxide film layer 35 is formed by the CVD method entirely on the surfaces of the memory cell portion and the peripheral circuitry portion.

Figure 3F:
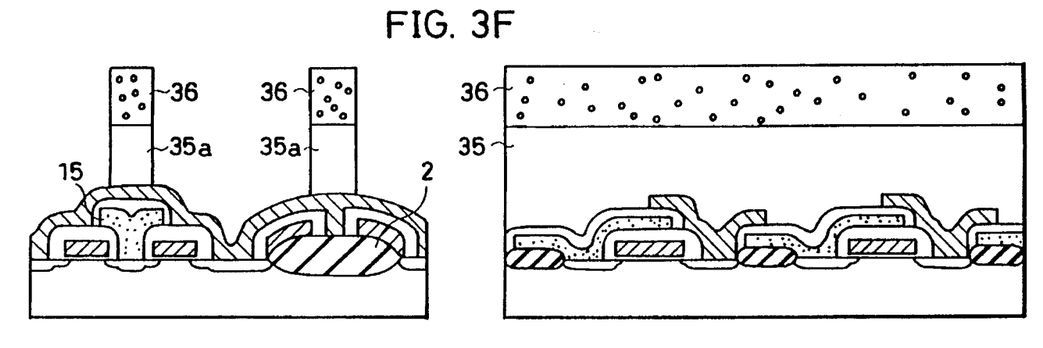

Then, referring to FIG. 3F, a resist 36 is applied on the surface of the oxide film layer 35, and a resist in the memory cell.portion is patterned to a prescribed shape. Then, the oxide film layer 35 is removed by etching, using the resist 36 as a mask. Consequently, oxide films 35a for forming the capacitor are formed only on the bit line 15 and on the field oxide film 2, in the memory cell portion.

Figure 3G:
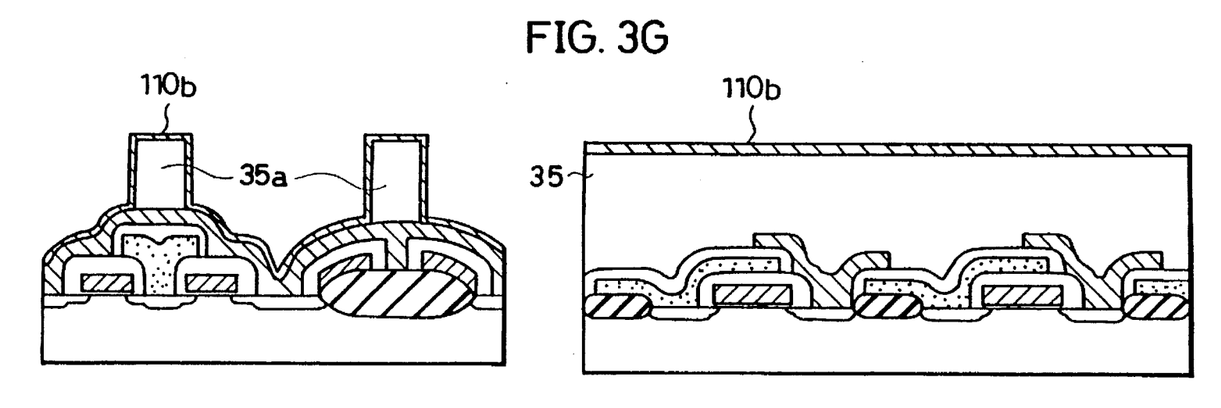

Referring to FIG. 3G, a doped polysilicon layer 110b is formed to the thickness of about 500 Å on the entire surface, by the CVD method.

Figure 3H:
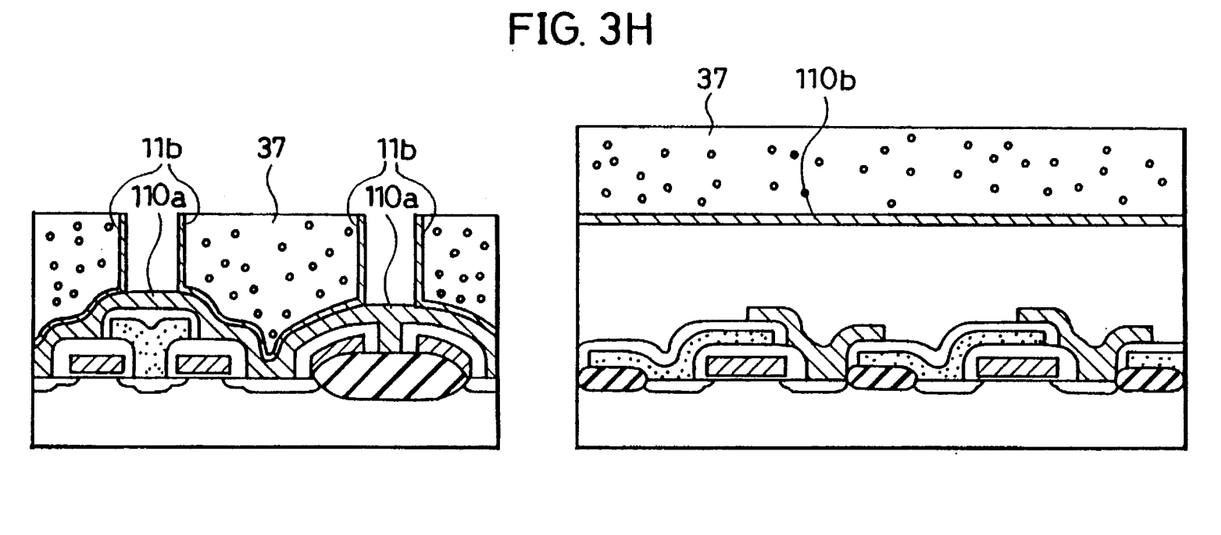

Then, referring to FIG. 3H, resist is applied thick again on the entire surface, and etch back is effected. Consequently, surface portion of the doped polysilicon layer 110b formed above the oxide film 35a for forming the capacitor in the memory cell portion is exposed. Then, only the surface of the doped polysilicon layer 110b in the peripheral circuit portion is covered by a resist 37. Then, the exposed doped polysilicon layer 110b and the oxide film 35a in the memory cell portion are selectively removed, to form the wall portion 11b of the lower electrode of the capacitor 10.

Figure 3I:
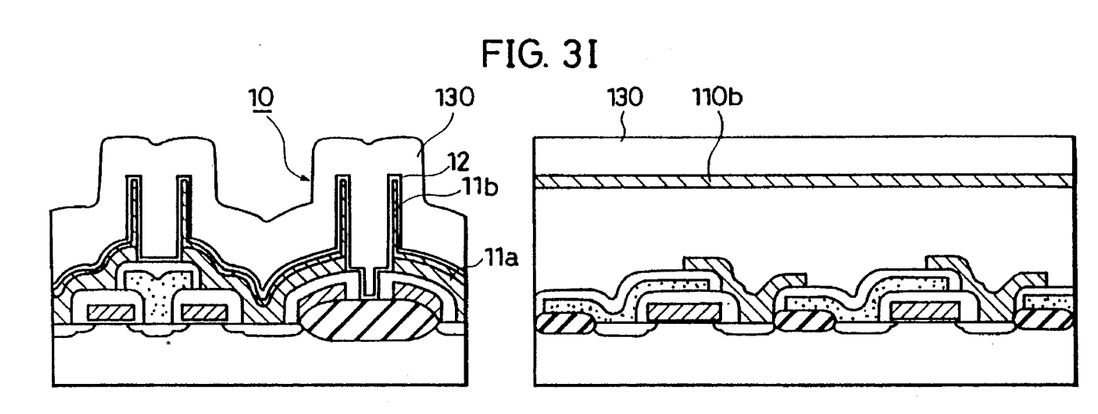

Further, referring to FIG. 3I, the doped polysilicon layer 11a extending between the adjacent wall portions 11b, 11b of the capacitor are removed by anisotropic etching. The lower electrode 11 of the capacitor is provided. Then, the resist 37 is removed. Thereafter, a dielectric layer 12 is formed on the surface of the lower electrode 11 of the capacitor, and a doped polysilicon layer 130 is deposited further thereon. At this time, the dielectric layer and the doped polysilicon layer 130 are formed on the upper surface of the doped polysilicon layer 110b in the peripheral circuitry portion.

Figure 3J:
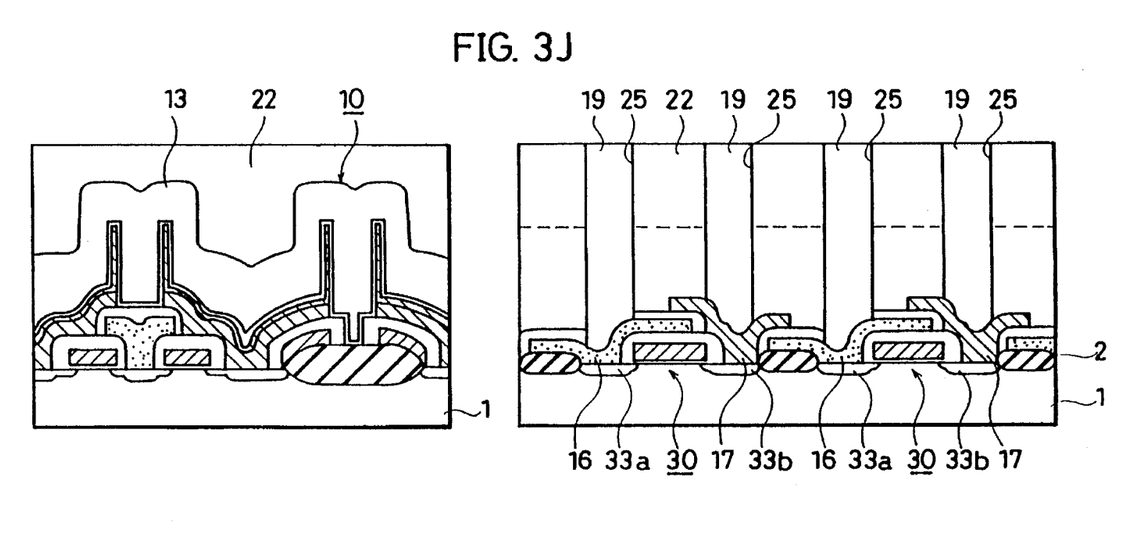

Thereafter, referring to FIG. 3J, the doped polysilicon 130 and the dielectric layer 12 are patterned to a prescribed shape and thus the dielectric layer 12 and the upper electrode 33 of the capacitor 10 are provided. By this patterning, the doped polysilicon layer 110b, the dielectric layer and the doped polysilicon layer 130 are removed in the peripheral circuitry portion. Thereafter, an interlayer insulating layer 22 is deposited on the entire surface of the silicon substrate 1, with the surface of the layer 22 made flat. In the peripheral circuitry portion, contact holes 25 reaching the first and second source•drain conductive layers 16 and 17 of the MOS transistor 30 are formed at prescribed portions in the interlayer insulating layer 22. The contact holes 25 may be positioned at the surface regions of the first and second source•drain conductive layers 16 and 17.

Thereafter, an interconnection layer is formed by patterning the same to a prescribed shape on the entire surface of the memory cell portion and the peripheral circuitry portion, and thus the DRAM of FIG. 2 is provided.

As described above, since the first and second source•drain conductive layers 16 and 17 of the MOS transistor 30 in the peripheral circuit are formed simultaneously with the bit line 15 and the lower electrode 11 of the capacitor 10 in the memory cell portion, it is not necessary to add new steps of manufacturing.

Figure 4:
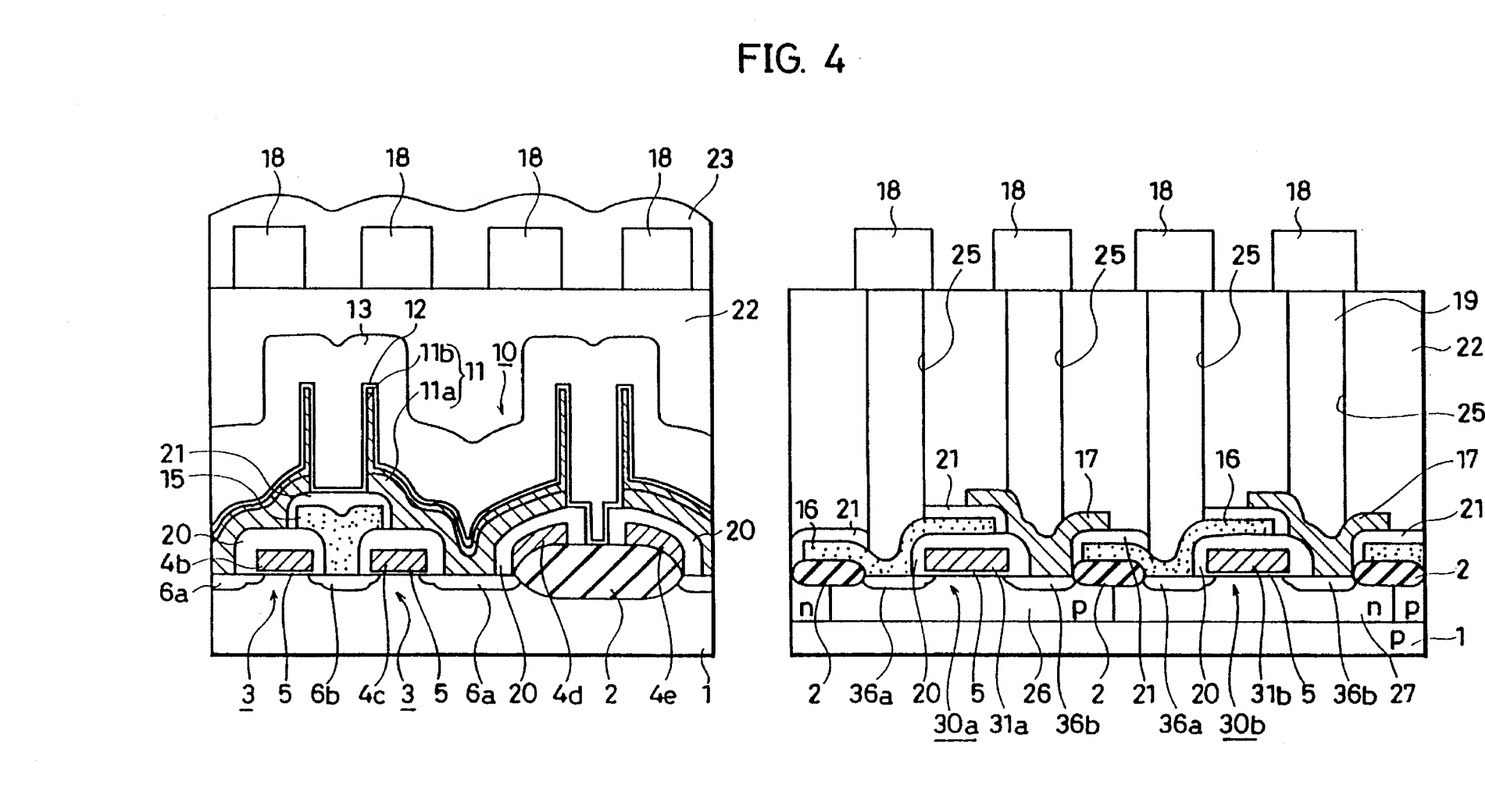
FIG. 4 is a cross sectional view of a DRAM showing a modification of an embodiment of the present invention.

A modification of the first embodiment will be described. In the modification shown in FIG. 4, an nMOS transistor 30a and a pMOS transistor 30b are juxtaposed in the peripheral circuitry portion. The nMOS transistor 30a is formed in a p well 26 formed at a surface of a p type silicon substrate 1, and the pMOS transistor 30b is formed in an n well region 27. N type impurities are introduced to the gate electrode 31a of the nMOS transistor 30a and p type impurities are introduced to the gate electrode 31b of the pMOS transistor 30b. In the memory cell portion, an nMOS transistor having n type impurities included in the gate electrodes 4b and 4c is formed as the transfer gate transistor 3.

In the above described embodiment, the first and second source•drain conductive layers 16 and 17 of the MOS transistor in the peripheral circuitry portion have been formed of doped.polysilicon. However, it is not limited thereto, and a high melting point metal layer, a high melting point metal silicide layer or the like which is the same as the material of the lower electrode 11a of the capacitor 10 or the bit line 15 may be used.

Although a MOS transistor have been employed in the peripheral circuitry portion in the above described embodiments, the present invention may be applied to other structures, for example a CMOS transistor structure.

In the DRAM in accordance with the present invention, contacts with an interconnection layer are realized by using third and fourth conductive layers which are in contact with source•drain regions of a MOS transistor included in the peripheral circuitry portion, so that the structure of the MOS transistor in the peripheral circuit portion can be made small. Since the third and fourth conductive layers are formed through the same process steps as the first and second conductive layers in the memory cell portion, reduction in size of the peripheral circuit portion can be realized without increasing the number of process steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM including a memory cell region having a plurality of memory cells each formed of at least one MOS transistor and one capacitor, and a peripheral circuit for writing/reading prescribed memory information to and from the memory cell region, on a main surface of a semiconductor substrate, said DRAM comprising:

a MOS transistor for each memory cell including a pair of first impurity regions formed in said semiconductor substrate and a first gate electrode formed on the semiconductor substrate between said pair of first impurity regions;

a MOS transistor for the peripheral circuit including a pair of second impurity regions formed in said semiconductor substrate and a second gate electrode formed on said semiconductor substrate between said pair of second impurity regions;

a first conductive layer connected to one of said first impurity regions of said MOS transistor for the memory cell;

a second conductive layer connected to the other one of said first impurity regions of said MOS transistor for the memory cell, to form a lower electrode of said capacitor;

a third conductive layer connected to one of said second impurity regions of said MOS transistor for the peripheral circuit and extending above at least a portion of said second gate electrode of said MOS transistor of the peripheral circuit; and a fourth conductive layer connected to another one of said second impurity regions of said MOS transistor for the peripheral circuit, and extending above at least a portion of said second gate electrode of said MOS transistor for the peripheral circuit and over at least a portion of said third conductive layer.

2. A DRAM according to claim 1, wherein a portion of said fourth conductive layer overlaps an upper portion of said third conductive layer, with an insulating layer interposed therebetween.

3. A DRAM according to claim 1, further comprising:

an interlayer insulating layer having a relatively flat upper surface formed on both said peripheral circuit and said memory cell region.

4. A DRAM according to claim 1, wherein said peripheral circuit comprises a plurality of MOS transistors, each of said plurality of MOS transistors including a pair of impurity regions formed in said semiconductor substrate and said third conductive layer and said fourth conductive layer are each connected to a respective one of said pair of impurity regions each of said plurality of MOS transistors.

5. A DRAM according to claim 1, wherein said first conductive layer and said third conductive layer are formed of the same material selected from the group consisting of polycrystalline silicon, high melting point metal, and a combination of polycrystalline silicon and high melting point metal silicide; and said second conductive layer and said fourth conductive layer are formed of the same material selected from the group consisting of polycrystalline silicon, high melting point metal, and a combination of polycrystalline silicon and high melting point metal silicide.

6. A DRAM including a memory cell region having a plurality of memory cells each formed on one MOS transistor and one capacitor, and a peripheral circuit for writing/reading prescribed memory information to and from the memory cell region, on a main surface of a semiconductor substrate, comprising:

a MOS transistor for each memory cell including a pair of first impurity regions formed in said semiconductor substrate and a first gate electrode formed on the semiconductor substrate between said pair of first impurity regions;

a MOS transistor for the peripheral circuit including a pair of second impurity regions formed in said semiconductor substrate and a second gate electrode formed on said semiconductor substrate between said pair of second impurity regions;

a first conductive layer connected to one of said first impurity regions of said MOS transistor for the memory cell;

a second conductive layer separate and distinct from said first conductive layer connected to the other one of said first impurity regions of said MOS transistor for the memory cell, to form a lower electrode of said capacitor;.

a third conductive layer connected to one of said second impurity regions of said MOS transistor for the peripheral circuit; and a fourth conductive layer separate and distinct from said first conductive layer connected to the other one of said second impurity regions of said MOS transistor for the peripheral circuit, wherein said second conductive layer overlaps an upper surface of said first conductive layer, and wherein a portion of said fourth conductive layer overlaps a portion of said third conductive layer, with an insulating layer interposed between said third and fourth conductive layers.

7. A DRAM according to claim 6, further comprising:

an interlayer insulating layer having a relatively flat upper surface formed on both said peripheral circuit and said memory cell region.

8. A DRAM according to claim 6, wherein said peripheral circuit comprises a plurality of MOS transistors, each of said plurality of MOS transistors including a pair of impurity regions formed in said semiconductor substrate and said third conductive layer and said fourth conductive layer are each connected to a respective one of said pair of impurity regions of each of said plurality of MOS transistors.

9. A DRAM according to claim 6, wherein said first conductive layer and said third conductive layer are formed of the same material selected from the group consisting of polycrystalline silicon, high melting point metal, and a combination of polycrystalline silicon and high melting point metal silicide; and said second conductive layer and said fourth conductive layer are formed of the same material selected from the group consisting of polycrystalline silicon, high melting point metal, and a combination of polycrystalline silicon and high melting point metal silicide.

10. A DRAM according to claim 1, wherein said peripheral circuit comprises a plurality of MOS transistors, including PMOS transistors and NMOS transistors, each of said plurality of MOS transistors including a pair of impurity regions formed in said semiconductor substrate and said third conductive layer and said fourth conductive layer are each connected to a respective one of said pair of impurity regions of each of said plurality of MOS transistors.

11. In a DRAM including a memory cell region having a plurality of memory cells each formed of at least one MOS transistor and one capacitor, a peripheral circuit for writing/reading prescribed memory information to and from the memory cell region, on a main surface of a semiconductor substrate, said peripheral circuit comprising:

a MOS transistor for the peripheral circuit including a pair of impurity regions formed in said semiconductor substrate and a gate electrode formed on said semiconductor substrate between said pair of impurity regions;

a first conductive layer connected to one of said impurity regions of said MOS transistor for the peripheral circuit and extending above at least a portion of said gate electrode of said MOS transistor of the peripheral circuit; and a second conductive layer connected to another one of said impurity regions of said MOS transistor for the peripheral circuit, and extending above at least a portion of said gate electrode of said MOS transistor for the peripheral circuit and over at least a portion of said first conductive layer.

12. The DRAM of claim 11, further comprising an interlayer insulating layer having a relatively flat upper surface formed on both said peripheral circuit and said memory cell region.

13. The DRAM of claim 11, wherein a portion of said second conductive layer is overlapped with an upper portion of said first conductive layer, with an insulating layer posed therebetween.

14. The DRAM according to claim 11, wherein said peripheral circuit comprises a plurality of MOS transistors, each of said plurality of MOS transistors including a pair of impurity regions formed in said semiconductor substrate and said first conductive layer and said second conductive layer are each connected to a respective one of said pair of impurity regions each of said plurality of MOS transistors.

15. The DRAM according to claim 11, wherein
said first conductive layer is formed of a material selected from the group consisting of polycrystalline silicon, high melting point metal, and a combination of polycrystalline silicon and high melting point metal silicide; and
said second conductive layer is formed of a material selected from the group consisting of polycrystalline silicon, high melting point metal, and a combination of polycrystalline silicon and high melting point metal silicide.

* * * * *